(12) United States Patent  (10) Patent No.: US 7,996,695 B2
Saint-Laurent et al.  (45) Date of Patent: Aug. 9, 2011

(54) CIRCUITS AND METHODS FOR SLEEP STATE LEAKAGE CURRENT REDUCTION

(75) Inventors: Martin Saint-Laurent, Austin, TX (US); Jentsung Lin, Cardiff by the Sea, CA (US)

(73) Assignee: QUALCOMM Incorporated, San Diego, CA (US)

( * ) Notice: Subject to any disclaimer, the term of this patent is extended or adjusted under 35 U.S.C. 154(b) by 712 days.

(21) Appl. No.: 12/032,059

(22) Filed: Feb. 15, 2008

(65) Prior Publication Data

US 2009/0210728 A1 Aug. 20, 2009

(51) Int. Cl.
*G06F 1/00* (2006.01)

(52) U.S. Cl. ........ 713/322; 713/300; 713/320; 365/228; 365/229; 327/202; 327/544

(58) Field of Classification Search .................. 713/300, 713/320, 322; 327/202, 544; 365/228, 229
See application file for complete search history.

(56) References Cited

U.S. PATENT DOCUMENTS

| | | | |
|---|---|---|---|
| 6,586,963 B2* | 7/2003 | Choi et al. | ...... 326/26 |
| 6,946,869 B2 | 9/2005 | Jacobson et al. | |
| 7,023,058 B2 | 4/2006 | Kanno et al. | |
| 7,080,270 B2* | 7/2006 | Yokozeki et al. | ...... 713/320 |
| 7,298,664 B2* | 11/2007 | Lee | ...... 365/229 |
| 7,328,413 B2* | 2/2008 | Kim et al. | ...... 365/226 |
| 7,391,249 B2 | 6/2008 | Lee et al. | |
| 2006/0206739 A1* | 9/2006 | Kim et al. | ...... 713/322 |
| 2007/0103201 A1 | 5/2007 | Lau et al. | |
| 2007/0168792 A1 | 7/2007 | Barowski et al. | |

OTHER PUBLICATIONS

International Search Report—PCT/US09/032924, International Search Authority—European Patent Office—May 4, 2009.
Written Opinion—PCT/US09/032924, International Search Authority—European Patent Office—May 4, 2009.

* cited by examiner

*Primary Examiner* — Abdelmoniem Elamin
(74) *Attorney, Agent, or Firm* — Peter M. Kamarchik; Nicholas J. Pauley; Jonathan Velasco

(57) ABSTRACT

A circuit for reducing sleep state current leakage is described. The circuit includes a hardware unit selected from at least one of a latch, a flip-flop, a comparator, a multiplexer, or an adder. The hardware unit includes a first node. The hardware unit further includes a sleep enabled combinational logic coupled to the first node, wherein a value of the first node is preserved during a sleep state.

20 Claims, 15 Drawing Sheets

US 7,996,695 B2

CIRCUITS AND METHODS FOR SLEEP STATE LEAKAGE CURRENT REDUCTION

FIELD OF THE DISCLOSURE

Embodiments of the inventive concepts disclosed herein relate generally to the field of data processing systems. More particularly, embodiments of the inventive concepts disclosed herein relate to circuits and methods for sleep state leakage current reduction.

BACKGROUND

Designs of electronics and computing devices have become increasingly concentrated on power conservation in order to improve performance in areas including battery life or heat emission. One area in conserving power is by reducing the amount of current leakage occurring within a circuit. Electrical circuits inherently have current leakage through different components. For example, in digital logic, each gate leaks some amount of current over time. Higher leakage means higher power consumption. One circuit state for reducing leakage current is standby or sleep state, wherein a circuit is not in use but may be in use at a later time. Therefore, a sleep state allows the circuit to conserve power by freezing active operation of the circuit (e.g., active switching of multiple components) and waiting to be placed from the sleep state into a non-sleep state. Hence, values currently existing in the circuit may be preserved in the sleep state until the circuit is brought out of the sleep state. As a result, values are not loaded into or recomputed by the circuit because the values already exist in the circuit when brought out of the non-sleep state.

The advantage of a sleep state over powering off the circuit is that the circuit is more easily brought into a non-sleep state from a sleep state over initializing the circuit. In initialization, a circuit loads or computes the values that would have been stored in a sleep state. Therefore, time and power is lost during initialization. But when a circuit is in a sleep state, current may leak from the components of the circuit as power may still be applied to them. Therefore, leakage current still exists in the circuit during a sleep state.

In one approach, the overall leakage current may be reduced by placing different nodes of the circuit at predetermined logic values during a sleep state. For example, a logic one at a node of the circuit may have a lower leakage current than the circuit with a logic zero at the node. Again, though, the values of certain nodes in the circuit are to be preserved while forcing other various nodes of the circuit to a logic value.

In one implementation to the approach, a logic AND gate is inserted at each of the predefined nodes with an input that is lowered to a logic zero when the circuit is to enter a sleep state. Therefore, the predefined node is split so that the input to the AND gate preserves a value while the output from the AND gate forces the node to a predetermined logic value. In addition, a number of AND gates equal to the number of nodes is added to the circuit, thus adding more logic to the circuit. One problem with the implementation is that the inserted gate itself is leaky. In addition to increasing the circuit size and degrading the circuit timing, the inserted gate may substantially increase power consumption.

In another implementation, existing logic gates are modified in order to add a transistor in series with the pull up stack of the gate and another transistor in parallel with the pull down stack, or vice-versa. Hence, the transistors allow the output of the gate to be forced to a logic one or a logic zero. Problems, though, are that conventional cell libraries may not be used and the modified gates are slower and require more area. In another implementation, a preexisting scan chain of a circuit is used in order to scan in a predefined output vector into the latches of the circuit, thereby forcing the outputs of the latches to specific values. One problem with the implementation is that scanning in a vector takes multiple steps of switching latches. Thus, scanning the vector into the chain takes time and drains power.

SUMMARY OF THE DISCLOSURE

In an embodiment, a circuit for reducing sleep state current leakage is described. A circuit for reducing sleep state current leakage is described. The circuit includes a hardware unit selected from at least one of a latch, a flip-flop, a comparator, a multiplexer, or an adder. The hardware unit includes a first node. The hardware unit further includes a sleep enabled combinational logic coupled to the first node, wherein a value of the first node is preserved during a sleep state.

Advantages of one or more embodiments disclosed herein may include minimal size increase to the circuit, no requirement for special logic gate libraries, speed in placing a circuit from a sleep state into a non-sleep state, and reduced power consumption (leakage current) of the circuit during a sleep state.

This illustrative embodiment is mentioned not to limit or define the inventive concepts disclosed herein, but to provide examples to aid understanding thereof. Other aspects, advantages, and features of the present disclosure will become apparent after review of the entire application, including the following sections: Brief Description of the Drawings, Detailed Description, and the Claims.

BRIEF DESCRIPTION OF THE DRAWINGS

These and other features, aspects, and advantages of the present inventive concepts disclosed herein are better understood when the following Detailed Description is read with reference to the accompanying drawings, wherein.

DETAILED DESCRIPTION

Figure 1:
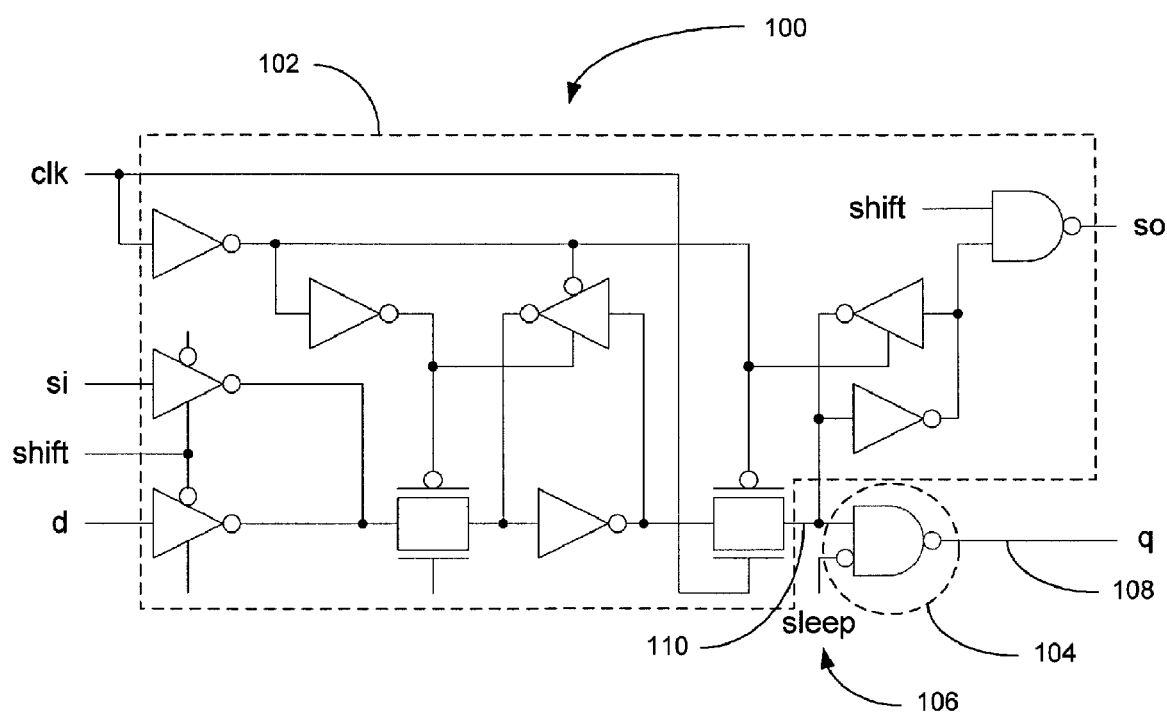
FIG. 1 is a schematic illustrating an example hardware unit with a sleep enabled NAND gate.

Throughout the description, for the purposes of explanation, numerous specific details are set forth in order to provide a thorough understanding of the inventive concepts disclosed herein. It will be apparent, however, to one skilled in the art that the inventive concepts disclosed herein may be practiced without some of these specific details. In other instances, well-known structures and devices are shown in block diagram form to avoid obscuring the underlying principles of the inventive concepts disclosed herein.

Embodiments of the inventive concepts disclosed herein relate to circuits and methods for sleep state leakage current reduction. In reducing leakage current of a circuit, nodes of the circuit may be selected to be forced to a predetermined logic state. As previously stated, nodes at different logic states affect the leakage current of the circuit. In one embodiment, the outputs of hardware units in a circuit may be the selected nodes of the circuit, wherein the output of a hardware unit is coupled to the input of subsequent circuitry. Hardware units may be circuit components comprising a conventional output driver. One example output driver is an inverter. Other examples may include, but are not limited to, conventional logic gates such as NAND or NOR gates, latches, adders, voltage level shifters, and comparators.

An output value of a hardware unit may be preserved while forcing the input to the subsequent circuitry to a predetermined logic value by replacing the conventional output driver of the hardware unit, which could be an inverter, a NAND gate, a NOR gate, or another conventional combinational logic gate, with a sleep enabled combinational logic configured to receive a sleep signal. Therefore, no additional number of gates are added to the circuit since preexisting gates may be replaced. In one embodiment, the sleep enabled combinational logic includes, but is not limited to, a NAND gate, a NOR gate, an AND gate, an OR gate, or a multiplexer wherein one input of the combinational logic is coupled to the output of the hardware unit and another input is connected to a sleep signal that enables the sleep enabled combinational logic to switch between a non-sleep state (e.g., active operation of the circuit) and a sleep state (e.g., when the circuit is placed into hibernation). Sleep enabled combinational logic may replace from one to all conventional output drivers in a circuit. In one embodiment, sleep enabled combinational logic are strategically replaced for select output drivers by observing, e.g., empirical research as to which places affect more the leakage current of the circuit. In another embodiment, sleep enabled combinational logic may replace every conventional output driver in a circuit.

When the sleep signal is disabled (e.g., a logic zero), the sleep enabled combinational logic may transmit the output value of the hardware unit to the input of the subsequent circuitry. In addition, the sleep enabled combinational logic may invert the output value of the hardware unit, thus performing the operation of some conventional output drivers. When the sleep signal is enabled (e.g., a logic one), the sleep enabled combinational logic may block transmission of the output value (e.g., the state "q") of the hardware unit, preserving the value in the hardware unit or on the output node of the hardware unit, and output a predetermined logic value depending on the type and configuration of the sleep enabled combinational logic. For example, a NOR gate outputs a logic zero when the sleep signal is enabled while a NAND gate outputs a logic one when the sleep signal is enabled.

The schematics of FIGS. 1-7 illustrate embodiments of a portion of a circuit including a hardware unit and a sleep enabled combinational logic. The schematics of FIGS. 1-4 illustrate embodiments of the sleep enabled combinational logic being a NAND gate 104 (FIG. 1), a NOR gate 202 (FIG. 2), a multiplexer 302 (FIG. 3), and an OR gate 402 (FIG. 4) coupled to the output of a hardware unit 102.

Referring to FIG. 1, the circuit 100 includes a hardware unit 102 coupled to a sleep enabled combinational logic 104. The hardware unit 102 is a conventional flip-flop minus an output inverter conventionally located at the position of the sleep enabled combinational logic 104. A flip-flop is a digital component that is able to store a logic value for one or more clock cycles. In addition to other uses, a flip-flop may be used to continually output a value or delay an output of a value for a predetermined number of clock cycles.

In one embodiment, a flip-flop may receive a clock signal (clk), a scan-in signal (si), a shift signal, and an input value (d). The flip-flop may output an output value (q) and a scan-out signal (so). The shift signal may be the signal used to enable a scan chain so that values are input to and output from the si and so, respectively, of the flip-flop. A scan-in signal (si) may be a scan chain value input to the flip-flop. A scan-out signal (so) may be the scan chain output signal from the flip-flop. The shift signal may control the flip-flop to shift a current scan chain value out of the flip-flop on so and receive a new scan chain value on si. In one embodiment, the so of a previous flip-flop is attached to the si of the current flip-flop so that a scanned out value from a previous flip-flop may be scanned into the current flip-flop. As a result, a value may be marched through a sequence of flip-flops organized in the scan chain. When shift is not enabled, the flip-flop may operate receiving d and outputting q (i.e., the scan chain is not enabled).

In one embodiment, when the circuit 100 is in a sleep state, then the sleep signal 106 is a logic one. Therefore, the output 108 of the NAND gate 104 is a logic one without reference to the value at the output 110 of the hardware unit 102. Thus, the hardware unit 102 stores its output value during the sleep state and the sleep enabled combinational logic 104 transmits a logic one to the input of subsequent circuitry.

Figure 2:
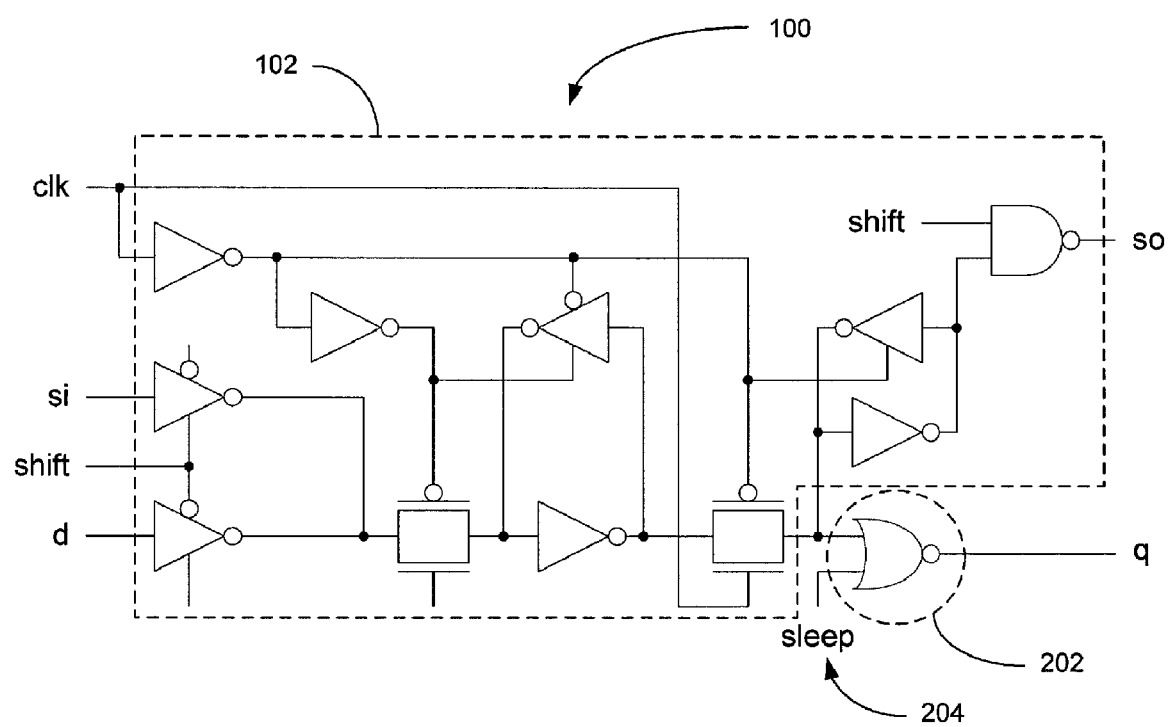
FIG. 2 is a schematic illustrating the example hardware unit of FIG. 1 with a sleep enabled NOR gate.

Referring to FIG. 2, the sleep enabled combinational logic 202 is a NOR gate. In this embodiment, when the circuit 100 is in a sleep state, then the sleep signal 204 is a logic one. Therefore, the output of the NOR gate 202 is a logic zero without reference to the output value of the hardware unit 102.

Figure 3:
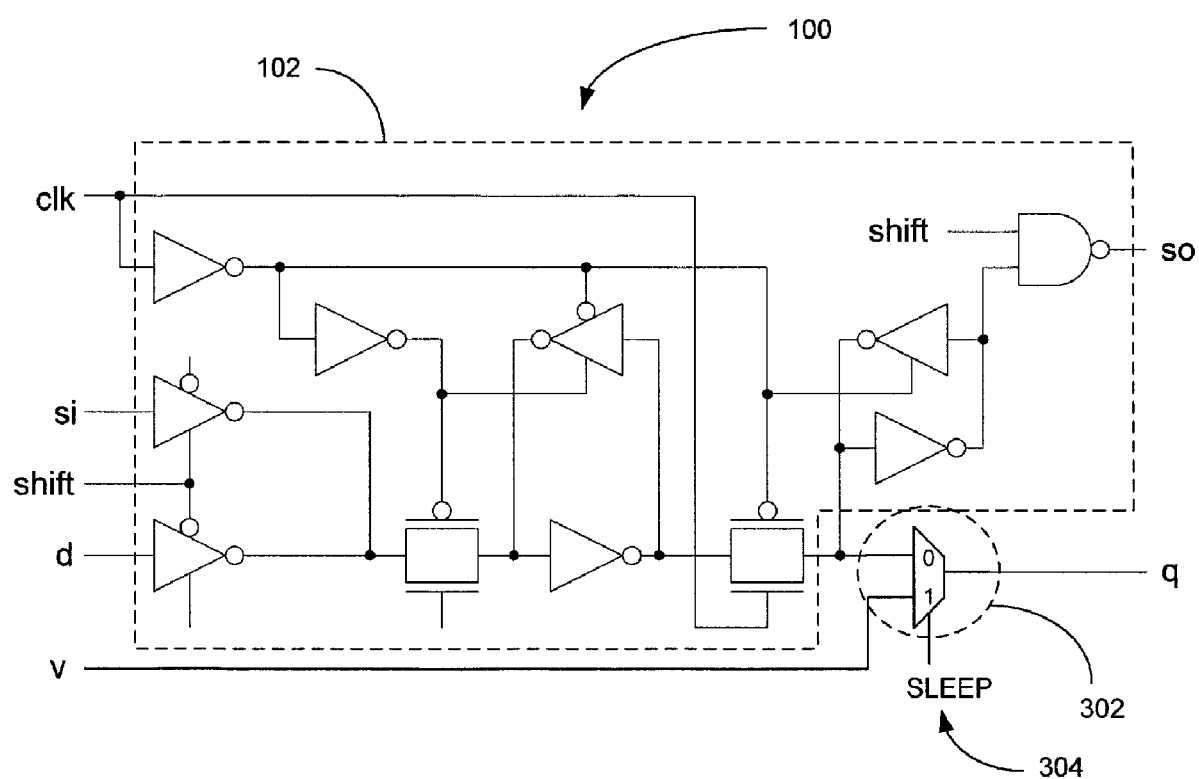
FIG. 3 is a schematic illustrating the example hardware unit of FIG. 1 with a sleep enabled multiplexer.

Referring to FIG. 3, the sleep enabled combinational logic 302 is a multiplexer. In this embodiment, when the circuit 100 is in a sleep state, the output of the multiplexer 302 is a logic one or zero depending on the value of input "v".

Figure 4:
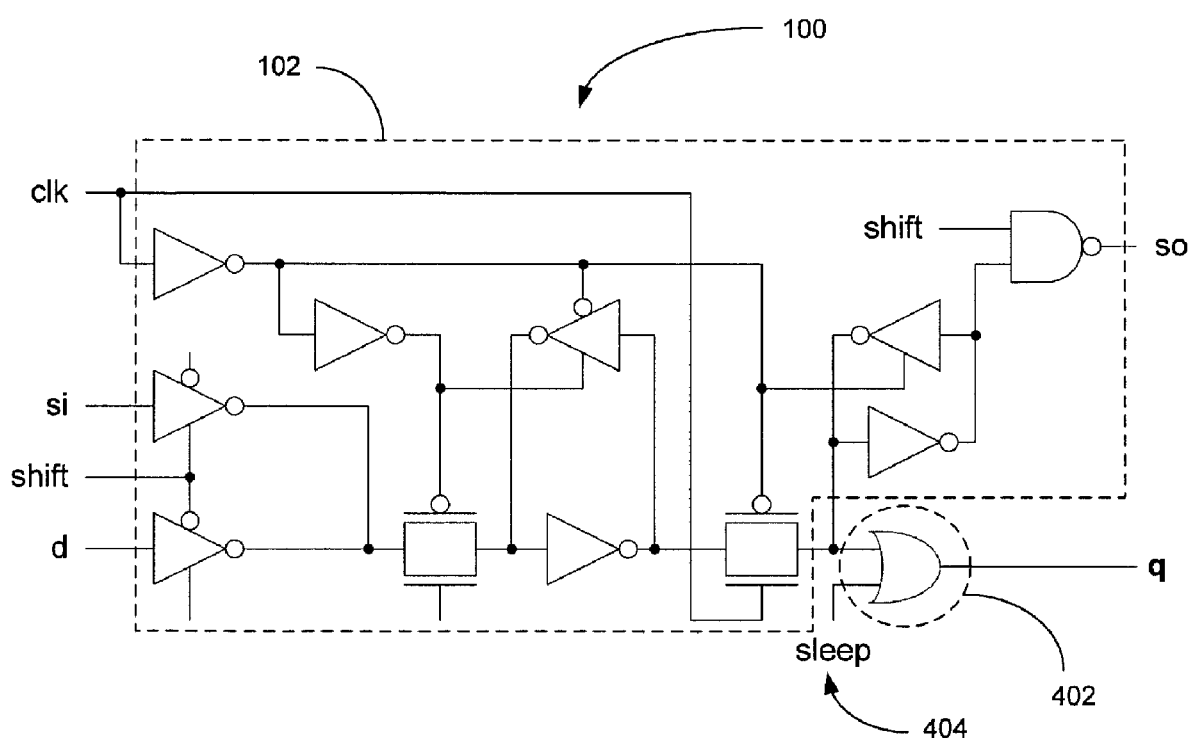
FIG. 4 is a schematic illustrating the example hardware unit of FIG. 1 with a sleep enabled OR gate.

Referring to FIG. 4, the sleep enabled combinational logic 402 is an OR gate. In this embodiment, when the circuit 100 is in a sleep state, the output of the OR gate 402 is a logic one without reference to the output value of the hardware unit 102.

In one embodiment, an output vector is a vector output of the sleep enabled combinational logic into the circuit. For example, if forty sleep enabled combinational logic exist in a circuit, then the output vector may be the forty bits outputted by the forty sleep enabled combinational logic to forty nodes of the circuit. Therefore, the leakage current of a circuit may be determined for each combination of bit values for the multiple sleep enabled combinational logic. Upon determining the possible leakage currents of the circuit for the various combinations, an output vector to be implemented during a sleep state may be selected in order to reduce the actual leakage current to exist in a circuit.

The value of the output vector to be implemented by the sleep enabled combinational logic may help determine which type or configuration of sleep enabled combinational logic is to be used. For example, the output of the NAND gate 104 in FIG. 1 during a sleep state (sleep signal 106 equal to logic one) is a logic one. The output of the NOR gate 202 in FIG. 2 during a sleep state (sleep signal 204 equal to logic one) is a logic zero. Hence, if a logic one is to be implemented, a NAND gate may be used, while if a logic zero is to be implemented, a NOR gate may be used. In another embodiment, the sleep enabled combinational logic may be configured to output a high impedance during a sleep state.

Figure 5:
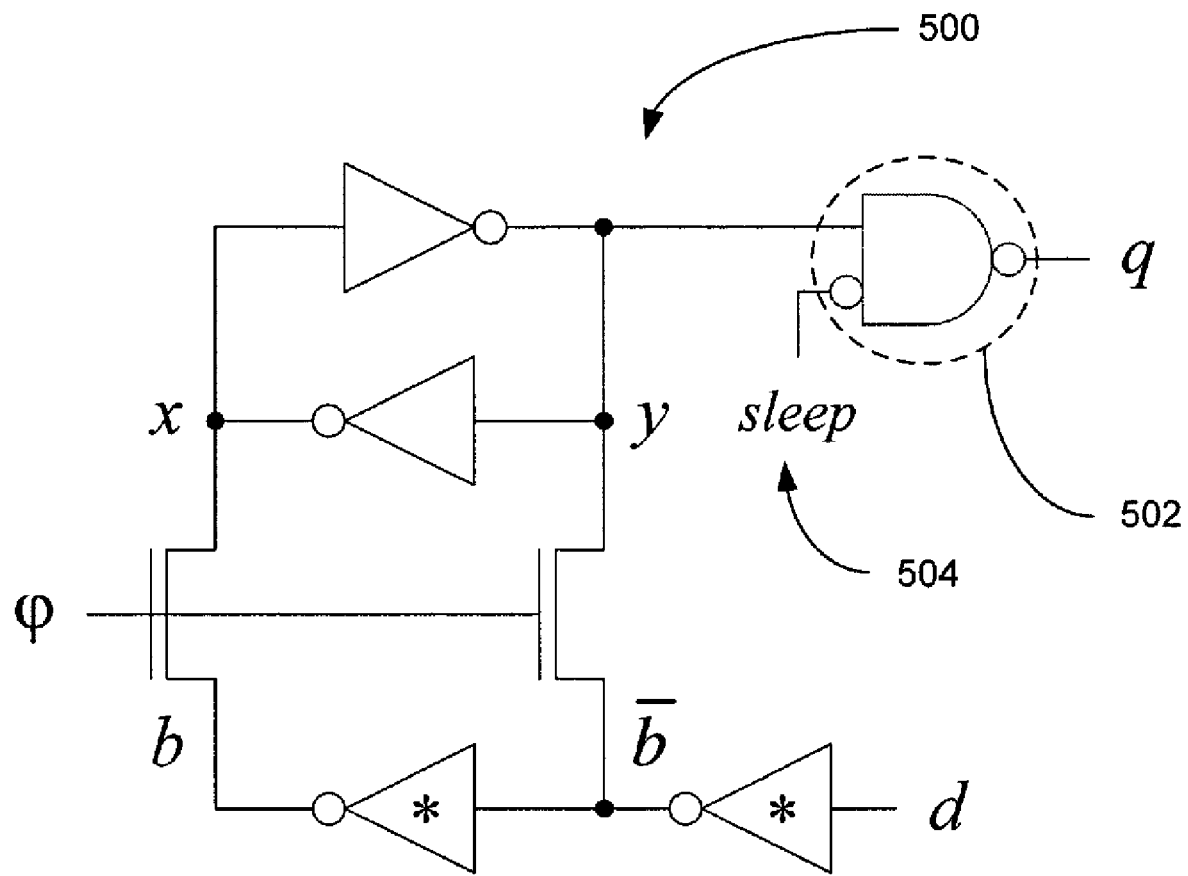
FIG. 5 is a schematic illustrating a second example hardware unit with a sleep enabled NAND gate.
Figure 6:
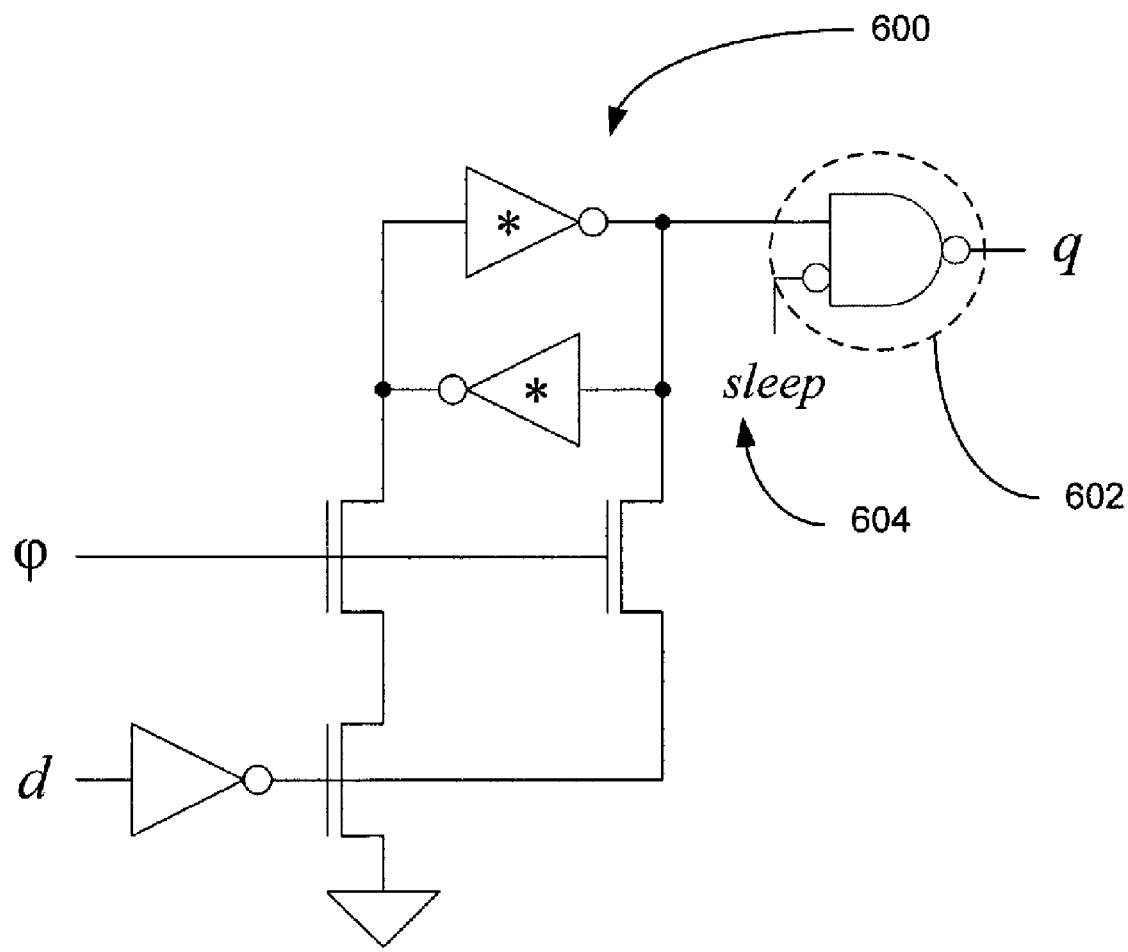
FIG. 6 is a schematic illustrating a third example hardware unit with a sleep enabled NAND gate.
Figure 7:
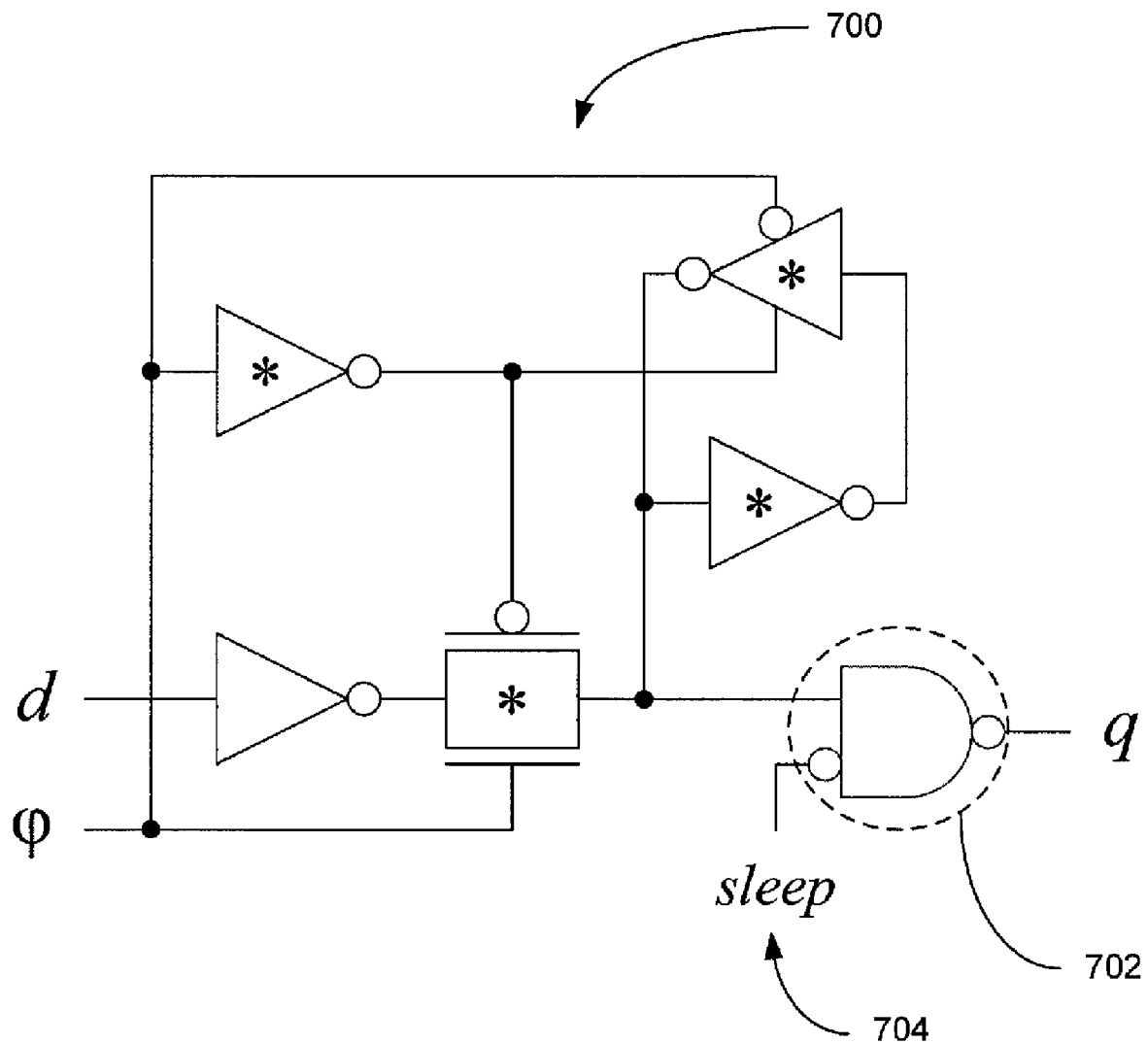
FIG. 7 is a schematic illustrating a fourth example hardware unit with a sleep enabled NAND gate.

The schematics of FIGS. 5-7 illustrate various embodiments with hardware units 500, 600, 700 coupled to a sleep enabled combinational logic 502, 602, 702 with a sleep signal 504, 604, 704 for enabling the sleep enabled combinational logic 502, 602, 702. In the embodiments shown in the schematics of FIGS. 5-7, the hardware units 500, 600, 700 shown are latches without a conventional output inverter located at the sleep enabled combinational logic 502, 602, 702.

Operation of Sleep Enabled Combinational Logic

Figure 8:
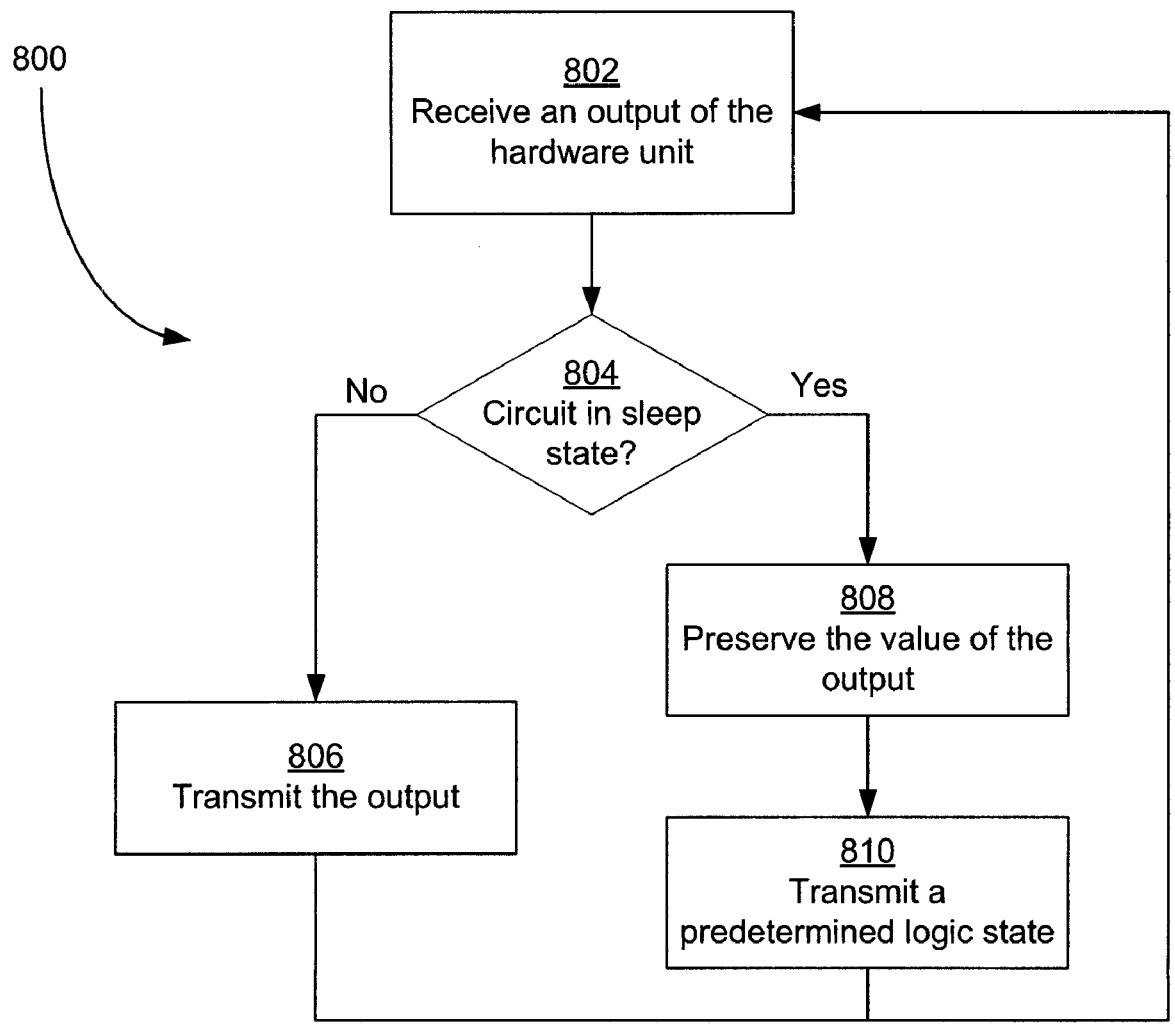
FIG. 8 is a flowchart illustrating an exemplary method for operation of the sleep enabled combination logic in FIGS. 1-7.

FIG. 8 is a flowchart illustrating an exemplary method 800 of operation of sleep enabled combinational logic, such as shown in the schematics of FIGS. 1-7. Beginning at 802, the sleep enabled combinational logic (e.g., logic 104) receives an output of the hardware unit (e.g., hardware unit 102). Proceeding to 804, the sleep enabled combinational logic determines if the circuit is or is not in a sleep state. In one embodiment, whether the circuit is or is not in a sleep state is determined by whether the sleep signal of a circuit is active or inactive. As previously described in one embodiment, if a sleep signal is active (e.g., a logic one), then a circuit is in a sleep state and the sleep enabled combinational logic is enabled. If the sleep signal is inactive (e.g., a logic zero), then the circuit is in a non-sleep state and the sleep enabled combinational logic is disabled.

Figure 9:
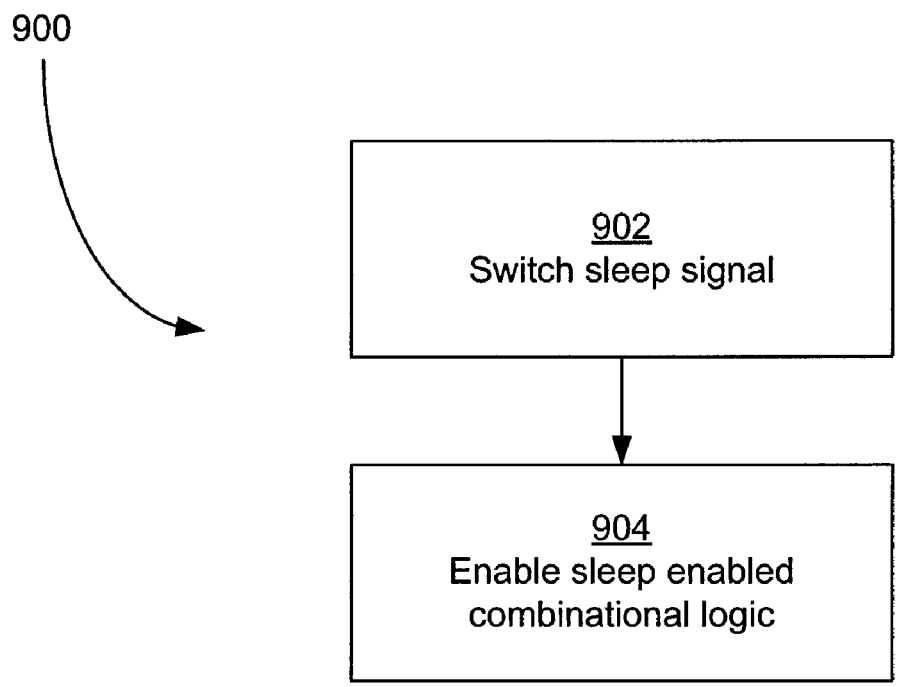
FIG. 9 is a flowchart illustrating an exemplary method for enabling the sleep enabled combinational logic in FIGS. 1-7.

FIG. 9 is a flowchart illustrating an exemplary method 900 for enabling sleep enabled combinational logic when the circuit is placed into a sleep state, such as shown in the schematics of FIGS. 1-7. Beginning at 902, the sleep signal (e.g., 106, 204, 304, 404, 504, 604, 704) is switched or activated. In one embodiment, the circuit begins to enter a sleep state upon receiving a control signal. The sleep signal may be the control signal or an output in response to receiving the control signal. For example, when the circuit is to enter the sleep state, the sleep signal is activated and controls the beginning of placing the circuit into the sleep state. In another example, the sleep signal is activated by circuitry upon receipt of the control signal to enter a sleep state. One embodiment of when a control signal to enter sleep state is to be issued includes circuitry outside or part of the circuit receiving an input from a user that the circuit is to go into a sleep state. In another embodiment, the circuitry may determine that no active operations are to be executed by the circuit or the circuit is without external input or idle for a predetermined amount of time before issuing the control signal.

Therefore, the sleep signal may be zero during a non sleep state and one during a sleep state, or vice-versa. Upon activating the sleep signal, the switched sleep signal enables the sleep enabled combinational logic from a non sleep state to a sleep state in 904. The sleep enabled combinational logic immediately or after some delay may be enabled upon switching the sleep signal. In a particular embodiment with multiple sleep enabled combinational logic, the time at which the sleep signal arrives at each sleep enabled combinational logic may be different. In another embodiment, the delay to go from a non-sleep state to a sleep state (or vice-versa) may be different for each sleep enabled combinational logic. For example, a sleep signal 106 equal to logic one in FIG. 1 forces the NAND gate 104 to output a logic one. In order to remove the sleep enabled combinational logic from a sleep state, in one embodiment, the sleep signal is deactivated by returning to a previous logic value (e.g., switching the sleep signal from a logic one to a logic zero).

Referring back to FIG. 8, if the circuit is not in a sleep state, then the sleep enabled combinational logic transmits the output of the hardware unit to the input of subsequent circuitry in 806. If the circuit is in a sleep state, then the sleep enabled combinational logic preserves the value of the output of the hardware unit in 808. As previously described in one embodiment of preserving the output value of a hardware unit, the sleep enabled combinational logic may block transmission of the output value to the input of subsequent circuitry. Therefore, the output value may be stored in the hardware unit or on the output node of the hardware unit during the sleep state. Proceeding to 810, the sleep enabled combinational logic transmits a predetermined logic state to the input of subsequent circuitry while the sleep signal is active (e.g., a logic one). The process may then revert to 802 and repeat for each signal received from the hardware unit.

Figure 10:
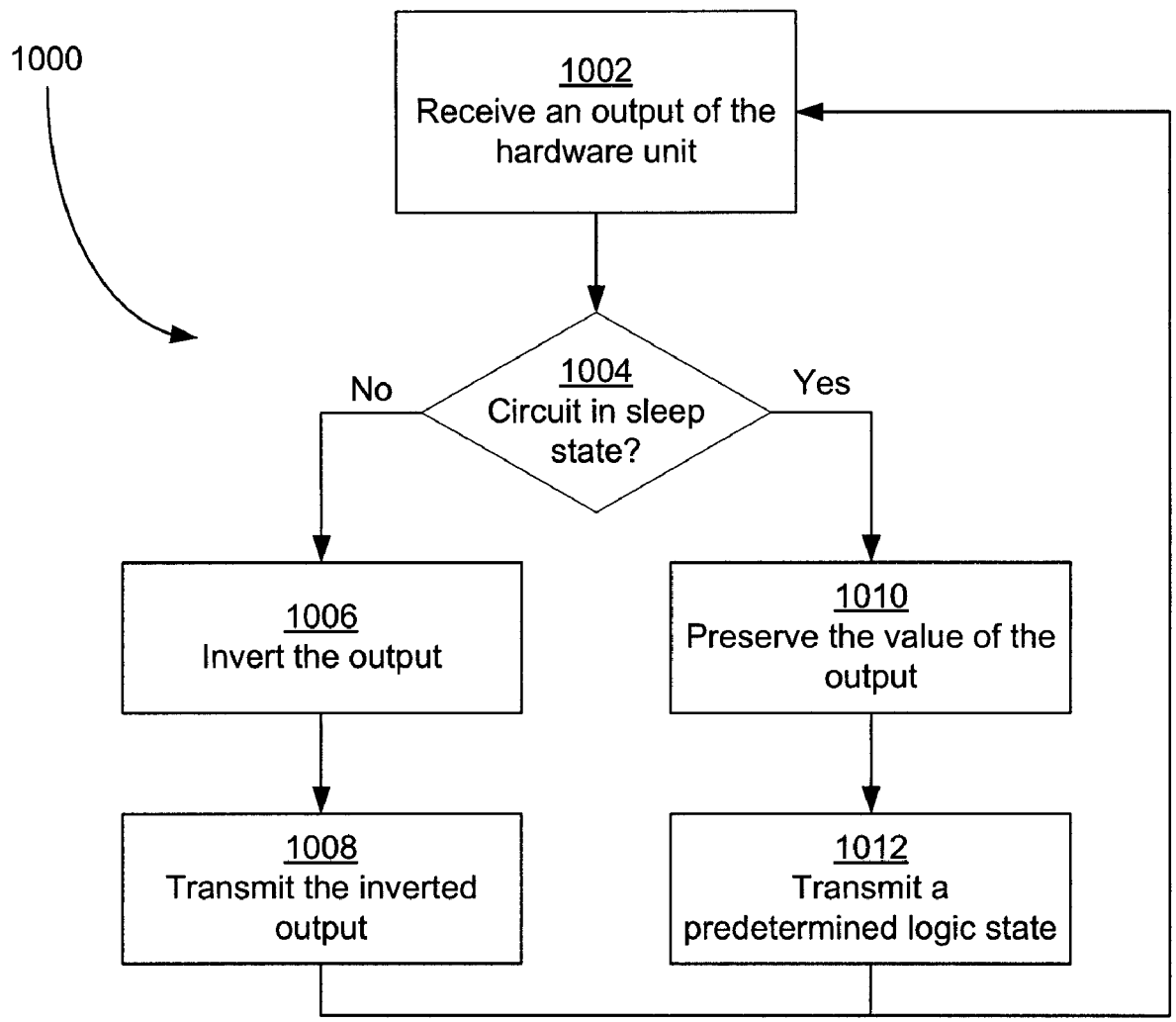
FIG. 10 is a flowchart illustrating an exemplary method for operation of the sleep enabled combinational logic in FIGS. 1-5.

FIG. 10 is a flowchart illustrating another exemplary method 1000 of operation of sleep enabled combinational logic. In the method 1000 illustrated by the flowchart of FIG. 10, the sleep enabled combinational logic inverts the value of the output of the hardware unit in addition to transmitting the output of a hardware unit during a non-sleep state.

Beginning at 1002, the sleep enabled combinational logic (e.g., logic 104) receives an output of the hardware unit (e.g., hardware unit 102). Proceeding to 1004, the sleep enabled combinational logic determines if the circuit is or is not in a sleep state. In one embodiment, whether the circuit is or is not in a sleep state is determined by whether the sleep signal of a circuit is active or inactive. As previously described in one embodiment, if a sleep signal is active (e.g., a logic one), then a circuit is in a sleep state and the sleep enabled combinational logic is enabled. If the sleep signal is inactive (e.g., a logic zero), then the circuit is in a non-sleep state and the sleep enabled combinational logic is disabled.

If the circuit is not in a sleep state, then the sleep enabled combinational logic inverts the value of the output of the hardware unit in 1006. As previously described, the sleep enabled combinational logic may perform the function of the replaced conventional inverter (i.e., inverting a value from one logic state to the other) when the circuit is in a non-sleep state. In one embodiment, NAND and NOR gates are configured to invert their output. For example, for a two input NAND gate, the two inputs are ANDed and inverted. Thus, if the inputs are zero and one, ANDing equals zero and inverting produces a one outputted by the NAND gate. In another example, for a two input NOR gate, the two inputs are ORed and inverted. Thus, if the inputs are zero and one, ORing equals one and inverting produces a zero outputted by the NOR gate. Hence, for the NAND gate 104 in FIG. 1, when the sleep signal 106 is a logic zero, conceptually, the sleep signal is inverted to a logic one and ANDed with the output of the hardware unit 102. Since the inverted sleep signal is a logic zero, the value of ANDing is the value of the output of the hardware unit 102. Thus, inverting the ANDed value produces the inverted output value 108 of the hardware unit 102 as being transmitted by the NAND gate 104.

Referring back to FIG. 10, the sleep enabled combinational logic transmits the inverted value to the input of subsequent circuitry in 1008. If the circuit is in a sleep state in 1004, then the sleep enabled combinational logic preserves the value of the output of the hardware unit in 1010. As previously described in one embodiment of preserving the output value of a hardware unit, the sleep enabled combinational logic may block transmission of the output value to the input of subsequent circuitry. Therefore, the output value may be stored in the hardware unit or on the output node of the hardware unit during the sleep state. Proceeding to 1012, the sleep enabled combinational logic transmits a predetermined logic state to the input of subsequent circuitry while the sleep signal is active (e.g., a logic one). The process may then revert to 1002 and repeat for each signal received from the hardware unit.

Example Devices Including the Above Described Features

Sleep enabled combination logic may be included in any digital circuitry, such as processors. The general diagrams of FIGS. 11-15 illustrate example devices that may incorporate sleep enabled combinational logic to implement an output vector during a sleep state.

Figure 11:
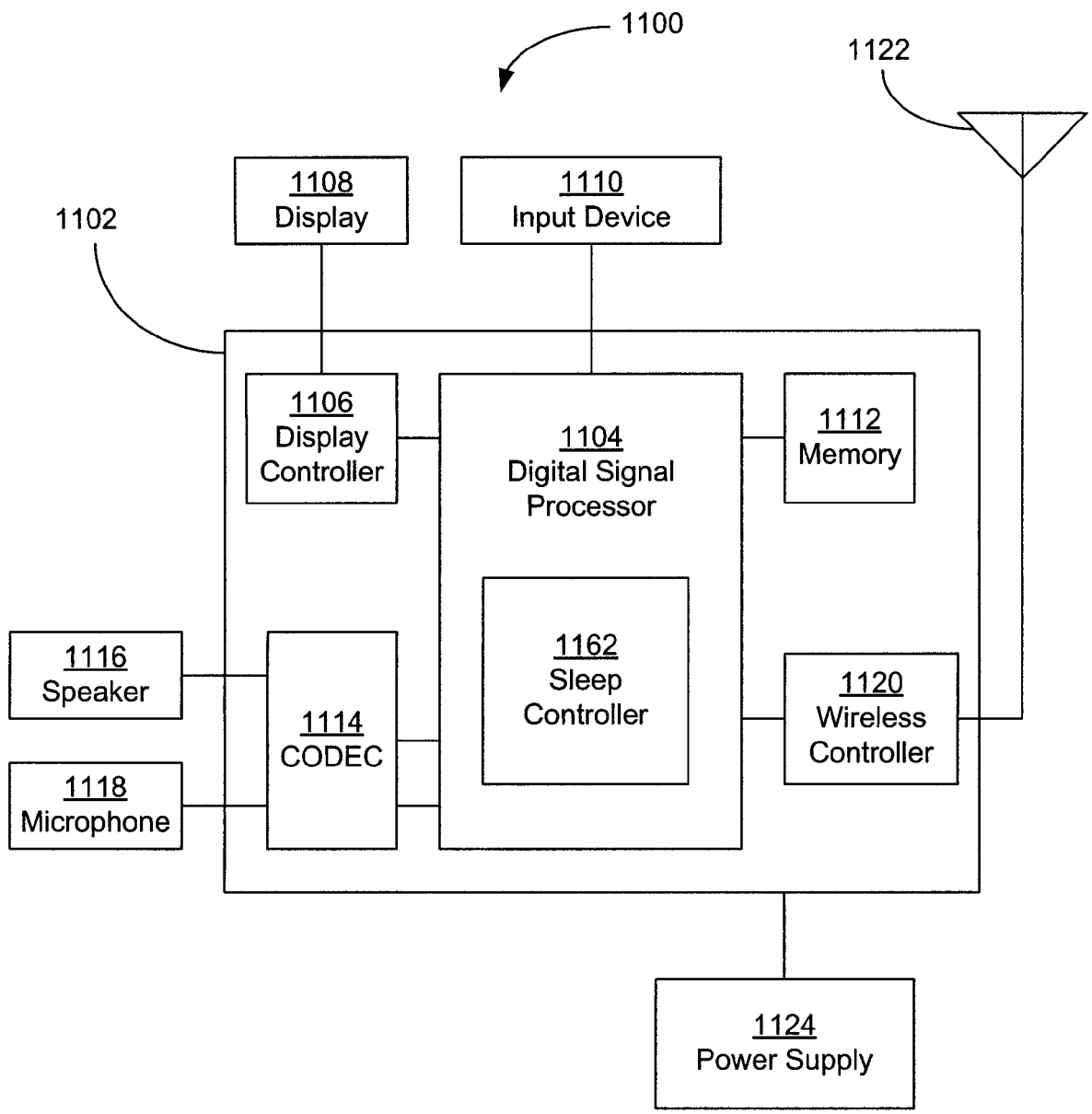
FIG. 11 is a general diagram illustrating an example portable communication device incorporating digital circuits (e.g., a digital signal processor) that may include sleep enabled combinational logic.

FIG. 11 is a diagram illustrating an exemplary embodiment of a portable communication device 1100. As illustrated in the general diagram of FIG. 11, the portable communication device includes an on-chip system 1102 that includes a digital signal processor (DSP) 1104. The general diagram of FIG. 11 also shows a display controller 1106 that is coupled to the digital signal processor 1104 and a display 1110. Moreover, an input device 1110 is coupled to the DSP 1104. As shown, a memory 1112 is coupled to the DSP 1104. Additionally, a coder/decoder (CODEC) 1114 may be coupled to the DSP 1104. A speaker 116 and a microphone 1118 may be coupled to the CODEC 1114.

The general diagram of FIG. 11 further illustrates a wireless controller 1120 coupled to the digital signal processor 1104 and a wireless antenna 1122. In a particular embodiment, a power supply 1124 is coupled to the on-chip system 602. Moreover, in a particular embodiment, as illustrated in FIG. 6, the display 626, the input device 630, the speaker 1116, the microphone 1118, the wireless antenna 1122, and the power supply 1124 are external to the on-chip system 1102. However, each is coupled to a component of the on-chip system 1102.

In a particular embodiment, the DSP 1104 includes sleep enabled combinational logic in order to implement an output vector and preserve values of hardware units during a sleep state. For example, when the device 1100 is placed into a sleep state, the sleep signals of the sleep enabled combinational logic are switched (enabling the sleep enabled combinational logic) and an output vector is output by the plurality of sleep enabled combinational logic in order to reduce leakage current and thus preserve the power supply 1124. In one embodiment, the DSP 1104 may include a sleep controller 1162 to switch the sleep enabled combinational logic. Hence, when a sleep signal or other signal may be received by the DSP 1104, the sleep controller 1162 receives the signal and controls the sleep enabled combinational logic. For example, the sleep controller may send the sleep signal in FIGS. 1-7 to activate the sleep enabled combinational logic. In another embodiment, the sleep controller may be located outside of the DSP 1104.

Figure 12:
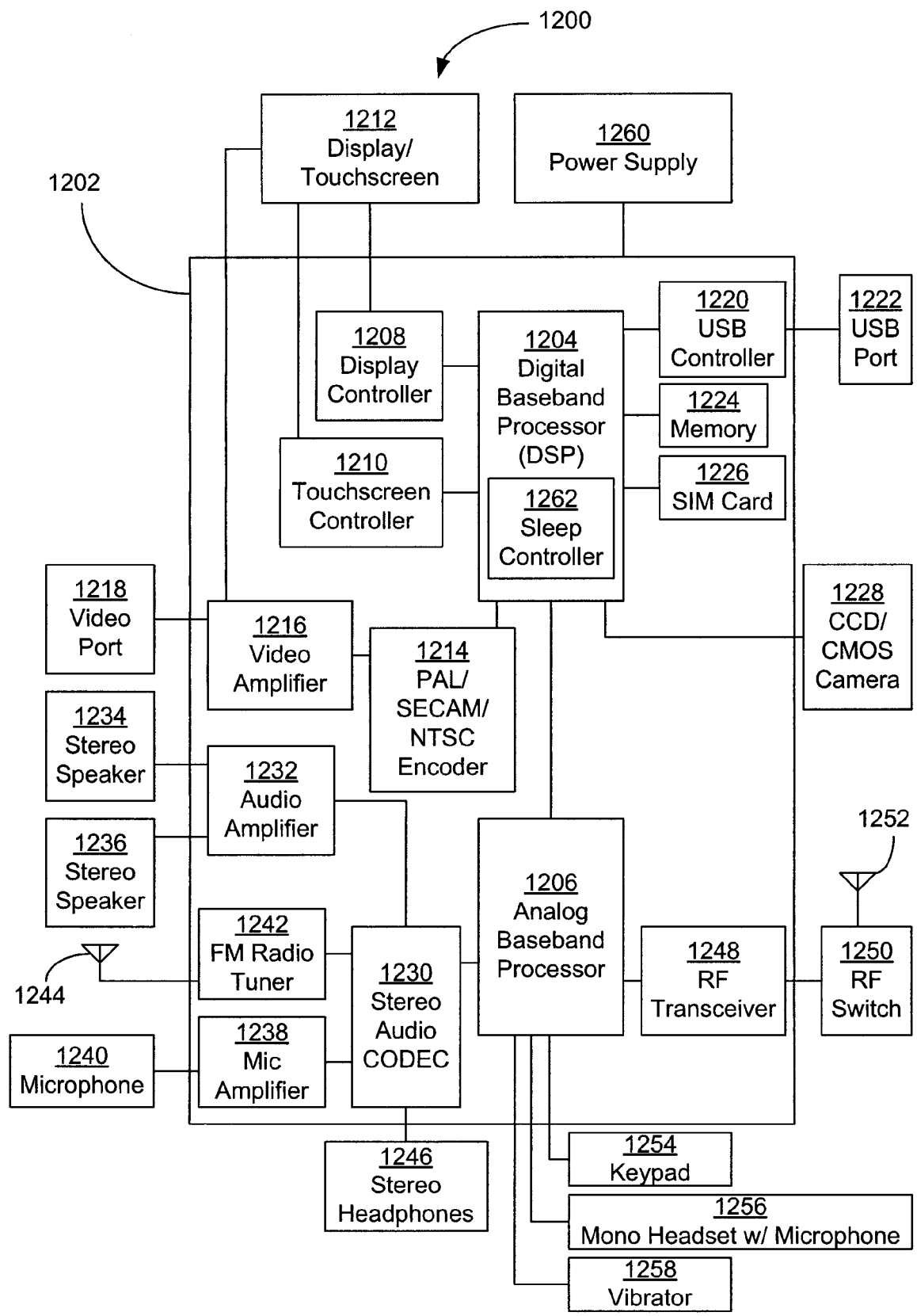
FIG. 12 is a general diagram illustrating an example cellular telephone incorporating digital circuits (e.g., a digital signal processor) that may include sleep enabled combinational logic.

FIG. 12 is a diagram illustrating an exemplary embodiment of a cellular telephone 1200. As shown, the cellular telephone 1200 includes an on-chip system 1202 that includes a digital baseband processor 1204 and an analog baseband processor 1206 that are coupled together. In a particular embodiment, the digital baseband processor 1204 is a digital signal processor. As illustrated in the general diagram of FIG. 12, a display controller 1208 and a touchscreen controller 1210 are coupled to the digital baseband processor 1204. In turn, a touchscreen display 1212 external to the on-chip system 1202 is coupled to the display controller 1208 and the touchscreen controller 1210.

The general diagram of FIG. 12 further illustrates a video encoder 1214, e.g., a phase alternating line (PAL) encoder, a sequential couleur a memoire (SECAM) encoder, or a national television system(s) committee (NTSC) encoder, is coupled to the digital baseband processor 1204. Further, a video amplifier 1216 is coupled to the video encoder 1214 and the touchscreen display 1212. Also, a video port 1218 is coupled to the video amplifier 1216. As depicted in the general diagram of FIG. 12, a universal serial bus (USB) controller 1220 is coupled to the digital baseband processor 1204. Also, a USB port 1222 is coupled to the USB controller 1220. A memory 1224 and a subscriber identity module (SIM) card 1226 may also be coupled to the digital baseband processor 1204. Further, as shown in the general diagram of FIG. 12, a digital camera 1228 may be coupled to the digital baseband processor 1204. In an exemplary embodiment, the digital camera 1228 is a charge-coupled device (CCD) camera or a complementary metal-oxide semiconductor (CMOS) camera.

As further illustrated in the general diagram of FIG. 12, a stereo audio CODEC 1230 may be coupled to the analog baseband processor 1206. Moreover, an audio amplifier 1232 may coupled to the stereo audio CODEC 1230. In an exemplary embodiment, a first stereo speaker 1234 and a second stereo speaker 1236 are coupled to the audio amplifier 1232. A microphone amplifier 1238 may be also coupled to the stereo audio CODEC 1230. Additionally, a microphone 1240 may be coupled to the microphone amplifier 1238. In a particular embodiment, a frequency modulation (FM) radio tuner 1242 may be coupled to the stereo audio CODEC 1230. Also, an FM antenna 1244 is coupled to the FM radio tuner 1242. Further, stereo headphones 1246 may be coupled to the stereo audio CODEC 1230.

The general diagram of FIG. 12 further illustrates a radio frequency (RF) transceiver 1248 may be coupled to the analog baseband processor 1206. An RF switch 1250 may be coupled to the RF transceiver 1248 and an RF antenna 1252. A keypad 1254 may be coupled to the analog baseband processor 1206. Also, a mono headset with a microphone 1256 may be coupled to the analog baseband processor 1206. Further, a vibrator device 1258 may be coupled to the analog baseband processor 1206. The general diagram of FIG. 12 also shows a power supply 1260 may be coupled to the on-chip system 1202. In a particular embodiment, the power supply 1260 is a direct current (DC) power supply that provides power to the various components of the cellular telephone 1200. Further, in a particular embodiment, the power supply is a rechargeable DC battery or a DC power supply that is derived from an alternating current (AC) to DC transformer that is coupled to an AC power source.

As depicted in the general diagram of FIG. 12, the touchscreen display 1212, the video port 1218, the USB port 1222, the camera 1228, the first stereo speaker 1234, the second stereo speaker 1236, the microphone 1240, the FM antenna 1244, the stereo headphones 1246, the RF switch 1250, the RF antenna 1252, the keypad 1254, the mono headset 1256, the vibrator 1258, and the power supply 1260 may be external to the on-chip system 1202.

In a particular embodiment, the digital baseband processor 1204 may include sleep enabled combinational logic in order to implement an output vector to reduce leakage current and preserve hardware unit values during a sleep state in order to preserve power from the power supply 1260. In one embodiment, the DSP 1204 may include a sleep controller 1262 to switch the sleep enabled combinational logic. Hence, when a sleep signal or other signal may be received by the DSP 1204, the sleep controller 1262 receives the signal and controls the sleep enabled combinational logic. For example, the sleep controller may send the sleep signal in FIGS. 1-7 to activate the sleep enabled combinational logic. In another embodiment, the sleep controller may be located outside of the DSP 1204.

Figure 13:
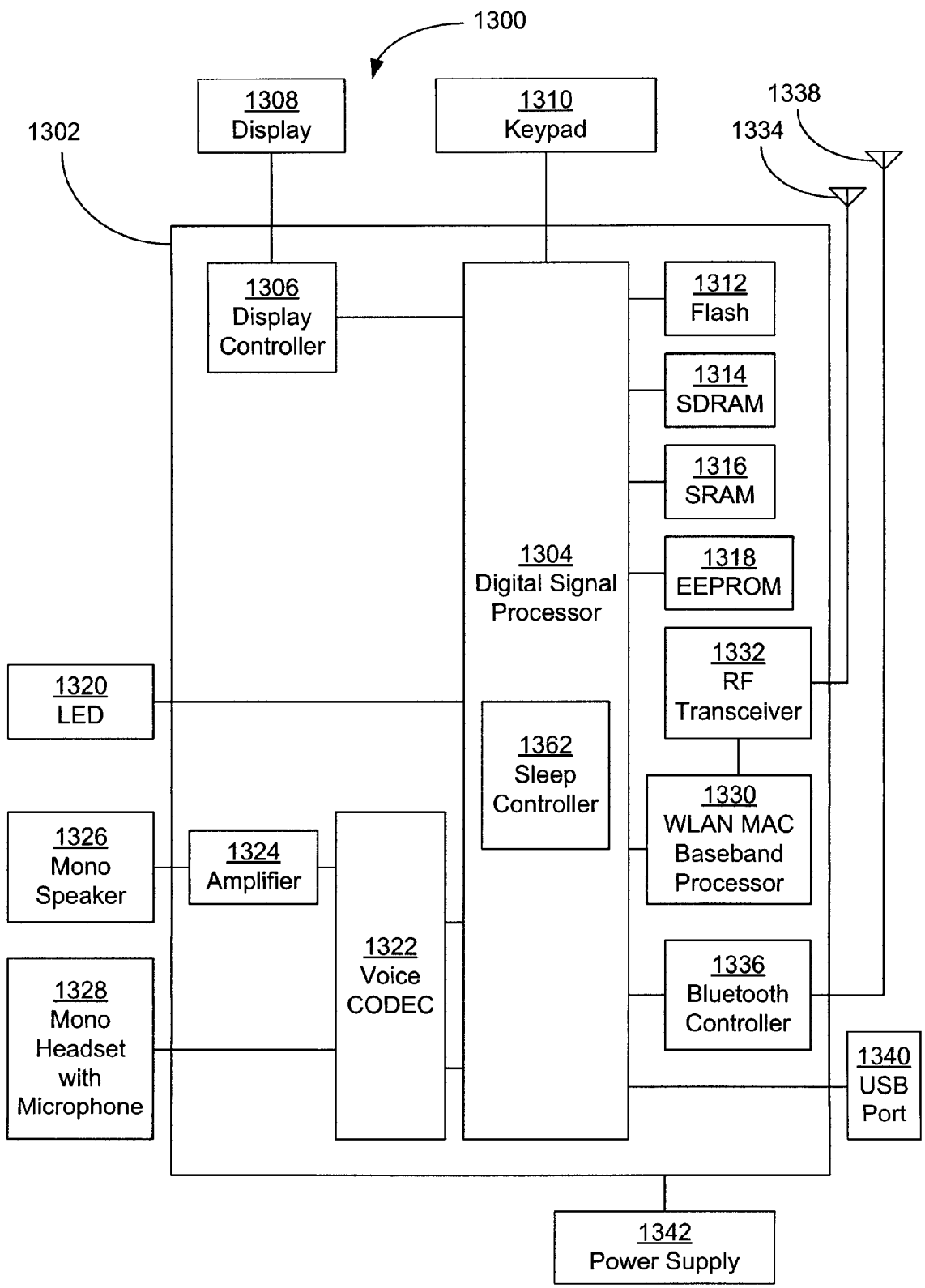
FIG. 13 is a general diagram illustrating an example wireless Internet Protocol telephone incorporating digital circuits (e.g., a digital signal processor) that may include sleep enabled combinational logic.

FIG. 13 is a diagram illustrating an exemplary embodiment of a wireless Internet protocol (IP) telephone 1300. As shown, the wireless IP telephone 1300 includes an on-chip system 1302 that includes a digital signal processor (DSP) 1304. A display controller 1306 may be coupled to the DSP 1304 and a display 1308 is coupled to the display controller 1306. In an exemplary embodiment, the display 1308 is a liquid crystal display (LCD). FIG. 13 further shows that a keypad 1310 may be coupled to the DSP 1304.

A flash memory 1312 may be coupled to the DSP 1304. A synchronous dynamic random access memory (SDRAM) 1314, a static random access memory (SRAM) 1316, and an electrically erasable programmable read only memory (EEPROM) 1318 may also be coupled to the DSP 1304. The general diagram of FIG. 13 also shows that a light emitting diode (LED) 1320 may be coupled to the DSP 1304. Additionally, in a particular embodiment, a voice CODEC 1322 may be coupled to the DSP 1304. An amplifier 1324 may be coupled to the voice CODEC 1322 and a mono speaker 1326 may be coupled to the amplifier 1324. The general diagram of FIG. 13 further illustrates a mono headset 1328 coupled to the voice CODEC 1322. In a particular embodiment, the mono headset 1328 includes a microphone.

A wireless local area network (WLAN) baseband processor 1330 may be coupled to the DSP 1304. An RF transceiver 1332 may be coupled to the WLAN baseband processor 1330 and an RF antenna 1334 may be coupled to the RF transceiver 1332. In a particular embodiment, a Bluetooth controller 1336 may also be coupled to the DSP 1304 and a Bluetooth antenna 1338 may be coupled to the controller 1336. The general diagram of FIG. 13 also shows that a USB port 1340 may also be coupled to the DSP 1304. Moreover, a power supply 1342 is coupled to the on-chip system 1302 and provides power to the various components of the wireless IP telephone 1300.

As indicated in the general diagram of FIG. 13, the display 1308, the keypad 1310, the LED 1320, the mono speaker 1326, the mono headset 1328, the RF antenna 1334, the Bluetooth antenna 1338, the USB port 1340, and the power supply 1342 may be external to the on-chip system 1302 and coupled to one or more components of the on-chip system 1302. In a particular embodiment, the DSP 1304 may include sleep enabled combinational logic in order to implement an output vector to reduce leakage current and preserve hardware unit values during a sleep state in order to preserve power from the power supply 1342. In one embodiment, the DSP 1304 may include a sleep controller 1362 to switch the sleep enabled combinational logic. Hence, when a sleep signal or other signal may be received by the DSP 1304, the sleep controller 1362 receives the signal and controls the sleep enabled combinational logic. For example, the sleep controller may send the sleep signal in FIGS. 1-7 to activate the sleep enabled combinational logic. In another embodiment, the sleep controller may be located outside of the DSP 1304.

Figure 14:
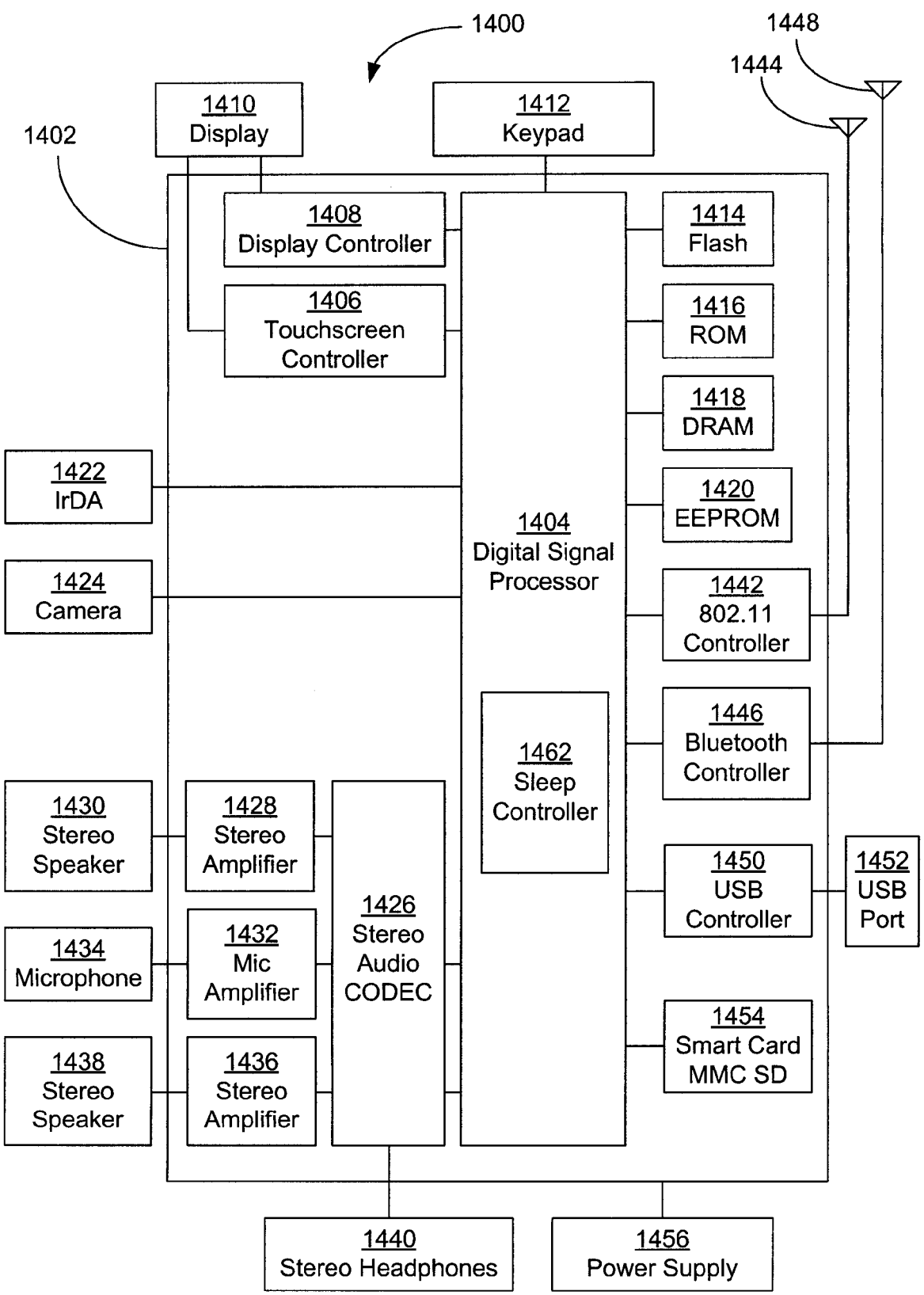
FIG. 14 is a general diagram illustrating an example portable digital assistant incorporating digital circuits (e.g., a digital signal processor) that may include sleep enabled combinational logic.

FIG. 14 is a diagram illustrating an exemplary embodiment of a portable digital assistant (PDA) 1400. As shown, the PDA 1400 includes an on-chip system 1402 that includes a digital signal processor (DSP) 1404. A touchscreen controller 1406 and a display controller 1408 are coupled to the DSP 1404. Further, a touchscreen display 1410 is coupled to the touchscreen controller 1406 and to the display controller 1408. The general diagram of FIG. 14 also indicates that a keypad 1412 may be coupled to the DSP 1404.

In a particular embodiment, a stereo audio CODEC 1426 may be coupled to the DSP 1404. A first stereo amplifier 1428 may be coupled to the stereo audio CODEC 1426 and a first stereo speaker 1430 may be coupled to the first stereo amplifier 1428. Additionally, a microphone amplifier 1432 may be coupled to the stereo audio CODEC 1426 and a microphone 1434 may be coupled to the microphone amplifier 1432. The general diagram of FIG. 14 further shows that a second stereo amplifier 1436 may be coupled to the stereo audio CODEC 1426 and a second stereo speaker 1438 may be coupled to the second stereo amplifier 1436. In a particular embodiment, stereo headphones 1440 may also be coupled to the stereo audio CODEC 1426.

The general diagram of FIG. 14 also illustrates that an 802.11 controller 1442 may be coupled to the DSP 1404 and an 802.11 antenna 1444 may be coupled to the 802.11 controller 1442. Moreover, a Bluetooth controller 1446 may be coupled to the DSP 1404 and a Bluetooth antenna 1448 may be coupled to the Bluetooth controller 1446. A USB controller 1450 may be coupled to the DSP 1404 and a USB port 1452 may be coupled to the USB controller 1450. Additionally, a smart card 1454, e.g., a multimedia card (MMC) or a secure digital card (SD), may be coupled to the DSP 1404. Further, a power supply 1456 may be coupled to the on-chip system 1402 and may provide power to the various components of the PDA 1400.

As indicated in the general diagram of FIG. 14, the display 1410, the keypad 1412, the IrDA port 1422, the digital camera 1424, the first stereo speaker 1430, the microphone 1434, the second stereo speaker 1438, the stereo headphones 1440, the 802.11 antenna 1444, the Bluetooth antenna 1448, the USB port 1452, and the power supply 1450 may be external to the on-chip system 1402 and coupled to one or more components on the on-chip system. In a particular embodiment, the DSP 1404 may include sleep enabled combinational logic in order to implement an output vector to reduce leakage current and preserve hardware unit values during a sleep state in order to preserve power from the power supply 1456. In one embodiment, the DSP 1404 may include a sleep controller 1462 to switch the sleep enabled combinational logic. Hence, when a sleep signal or other signal may be received by the DSP 1404, the sleep controller 1462 receives the signal and controls the sleep enabled combinational logic. For example, the sleep controller may send the sleep signal in FIGS. 1-7 to activate the sleep enabled combinational logic. In another embodiment, the sleep controller may be located outside of the DSP 1404.

Figure 15:
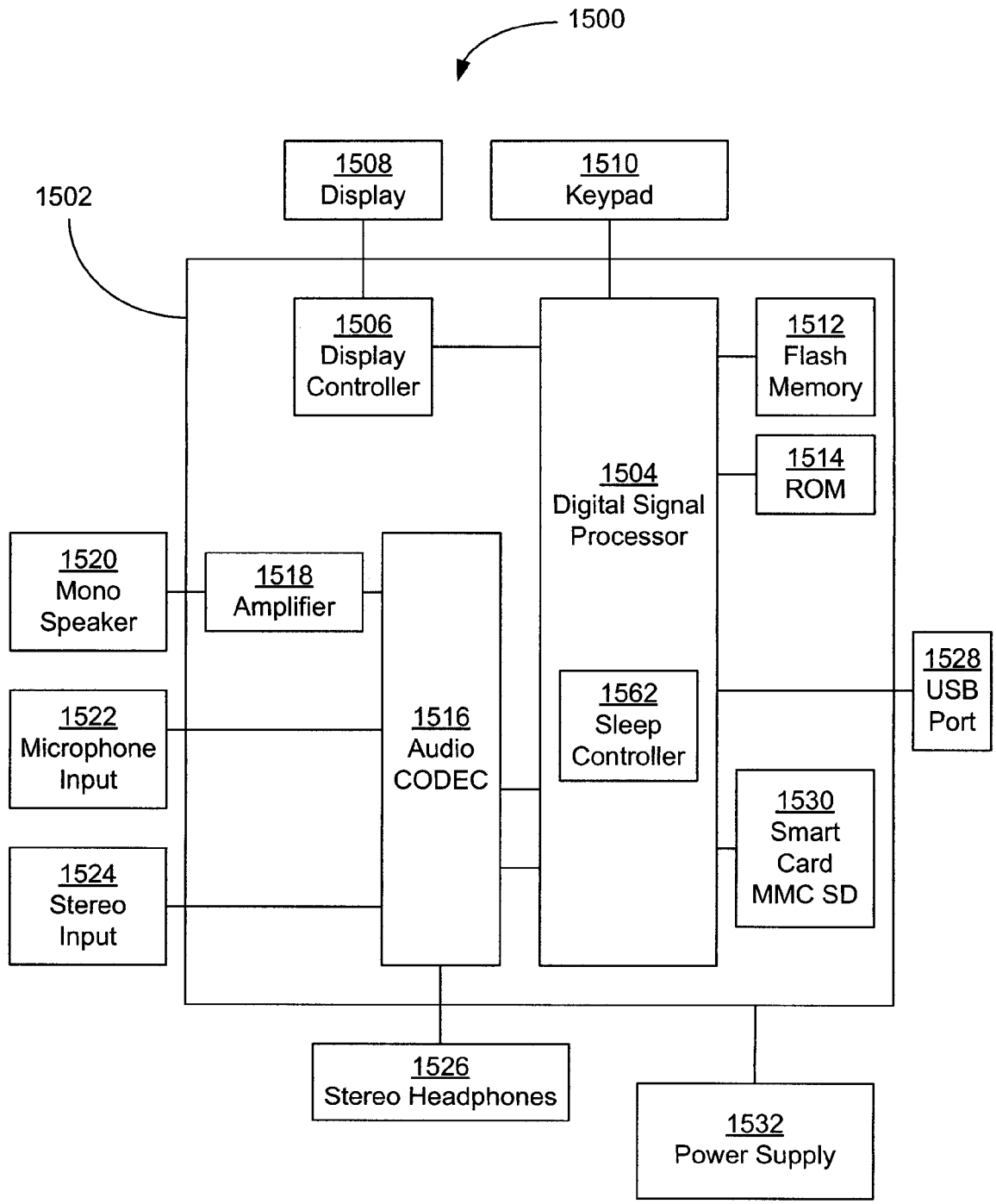
FIG. 15 is a general diagram illustrating an example audio file player incorporating digital circuits (e.g., a digital signal processor) that may include sleep enabled combinational logic.

FIG. 15 is a diagram illustrating an exemplary embodiment of an audio file player (e.g., MP3 player) 1500. As shown, the audio file player 1500 includes an on-chip system 1502 that includes a digital signal processor (DSP) 1504. A display controller 1506 may be coupled to the DSP 1504 and a display 1508 is coupled to the display controller 1506. In an exemplary embodiment, the display 1508 is a liquid crystal display (LCD). A keypad 1510 may be coupled to the DSP 1504.

As further depicted in the general diagram of FIG. 15, a flash memory 1512 and a read only memory (ROM) 1514 may be coupled to the DSP 1504. Additionally, in a particular embodiment, an audio CODEC 1516 may be coupled to the DSP 1504. An amplifier 1518 may be coupled to the audio CODEC 1516 and a mono speaker 1520 may be coupled to the amplifier 1518. The general diagram of FIG. 15 further indicates that a microphone input 1522 and a stereo input 1524 may also be coupled to the audio CODEC 1516. In a particular embodiment, stereo headphones 1526 may also be coupled to the audio CODEC 1516.

A USB port 1528 and a smart card 1530 may be coupled to the DSP 1504. Additionally, a power supply 1532 may be coupled to the on-chip system 1502 and may provide power to the various components of the audio file player 1500.

As indicated in the general diagram of FIG. 15, the display 1508, the keypad 1510, the mono speaker 1520, the microphone input 1522, the stereo input 1524, the stereo headphones 1526, the USB port 1528, and the power supply 1532 are external to the on-chip system 1502 and coupled to one or more components on the on-chip system 1502. In a particular embodiment, the digital signal processor 1504 may include sleep enabled combinational logic in order to implement an output vector to reduce leakage current and preserve hardware unit values during a sleep state in order to preserve power from the power supply 1532. In one embodiment, the DSP 1504 may include a sleep controller 1562 to switch the sleep enabled combinational logic. Hence, when a sleep signal or other signal may be received by the DSP 1504, the sleep controller 1562 receives the signal and controls the sleep enabled combinational logic. For example, the sleep controller may send the sleep signal in FIGS. 1-7 to activate the sleep enabled combinational logic. In another embodiment, the sleep controller may be located outside of the DSP 1504.

General

The foregoing description of the embodiments of the inventive concepts disclosed herein has been presented only for the purpose of illustration and description and is not intended to be exhaustive or to limit the inventive concepts disclosed herein to the precise forms disclosed. Numerous modifications and adaptations are apparent to those skilled in the art without departing from the spirit and scope of the inventive concepts disclosed herein.

What is claimed is:

1. A circuit, comprising:
   a hardware unit selected from at least one of a latch, a flip-flop, a comparator, a multiplexer, or an adder, the hardware unit comprising:
   a first node; and
   a sleep enabled combinational logic coupled to the first node, wherein a value of the first node is preserved during a sleep state, wherein an output of the sleep enabled combinational logic is configured to match a predefined value of an output vector when the sleep enabled combinational logic is enabled, and wherein a type of the sleep enabled combinational logic is dependent on a leakage current value associated with the output vector.

2. The circuit of claim 1, wherein the output vector depends on at least one of a design pattern of the circuit, a simulation of the circuit, or a fabrication process technology of the circuit.

3. The circuit of claim 1, wherein the sleep enabled combinational logic is configured to invert the value of the first node of the hardware unit when the sleep enabled combinational logic is not enabled.

4. The circuit of claim 3, further comprising a sleep signal as an input to the sleep enabled combinational logic to enable the sleep enabled combinational logic.

5. The circuit of claim 1, wherein the type of the sleep enabled combinational logic is selected from at least one of: a NAND gate, a NOR gate, an AND gate, an OR gate, or a multiplexer.

6. The circuit of claim 1, wherein the sleep enabled combinational logic is configured to replace an output inverter of the hardware unit.

7. The circuit of claim 1, wherein the sleep enabled combinational logic is configured to output a logic one, a logic zero, or a programmable logic value when enabled.

8. A method, comprising:
   preserving a node value of a first node of a hardware unit selected from at least one of a latch, a flip-flop, a comparator, a multiplexer, or an adder during a sleep state by asleep enabled combinational logic;
   matching a predefined value of an output vector during the sleep state by an output of the sleep enabled combinational logic, wherein a type of the sleep enabled combinational logic is dependent on a leakage current value associated with the output vector; and
   transmitting the node value of the hardware unit during a non-sleep state by the sleep enabled combinational logic.

9. The method of claim 8, further comprising inverting the node value of the hardware unit during the non-sleep state by the sleep enabled combinational logic.

10. The method of claim 9, further comprising enabling the sleep enabled combinational logic upon placing the hardware unit into the sleep state.

11. The method of claim 8, wherein the output vector depends on at least one of a design pattern of the circuit, a simulation of the circuit, or a fabrication process technology of the circuit.

12. A circuit, comprising:
   means for preserving a node value of a node of a hardware unit selected from at least one of a latch, a flip-flop, a comparator, a multiplexer, or an adder during a sleep state;
   means for outputting a predetermined value of an output vector during the sleep state, wherein a type of the means for preserving the node value is dependent on a leakage current value associated with the output vector; and
   means for transmitting the node value of the hardware unit during a non-sleep state.

13. The circuit of claim 12, further comprising means for inverting the node value of the hardware unit during the non-sleep state.

14. The circuit of claim 12, wherein the output vector depends on at least one of a design pattern of the circuit, a simulation of the circuit, or a fabrication process technology of the circuit.

15. The circuit of claim 12, wherein the predetermined value is one of a logic one, a logic zero, or a programmable logic value when enabled.

16. The method of claim 8, further comprising determining the leakage current value.

17. The method of claim 8, further comprising replacing an output inverter of the hardware unit with the steep enabled combinational logic.

18. The method of claim 8, further comprising configuring the sleep enabled combinational logic to output one of: a logic one, a logic zero, and a programmable logic value.

19. The method of claim 8, further comprising selecting the type of the sleep enabled combinational logic from at least one of: a NAND gate, a NOR gate, an AND gate, an OR gate, or a multiplexer.

20. The method of claim 8, further comprising generating a sleep signal as an input to the sleep enabled combinational logic to enable the sleep enabled combinational logic.

* * * * *